United States Patent
Schulz-Harder et al.

[11] Patent Number: 6,066,219
[45] Date of Patent: May 23, 2000

[54] PROCESS FOR PRODUCING A CERAMIC SUBSTRATE AND A CERAMIC SUBSTRATE

[75] Inventors: Jürgen Schulz-Harder, Lauf; Karsten Schmidt, Eschenbach; Karl Exel, Rimbach/Odw., all of Germany

[73] Assignee: Curamik Electronics GmbH, Germany

[21] Appl. No.: 08/794,516

[22] Filed: Feb. 3, 1997

[30] Foreign Application Priority Data

Feb. 2, 1996 [DE] Germany ............. 196 03 822

[51] Int. Cl.[7] ................................. C03B 29/00
[52] U.S. Cl. ................. 156/89.11; 156/89.18; 156/89.16; 156/307.1; 228/122; 228/124; 228/198; 228/219; 427/96; 427/99; 427/123; 427/126.3
[58] Field of Search ........................ 428/698, 212, 428/213, 216, 328, 329, 334, 446, 699, 701, 704; 427/96, 99, 123, 126.2, 126.3; 228/122, 124, 219, 198; 156/47, 51, 89, 89.11, 89.18, 89.16, 307.1

[56] References Cited

U.S. PATENT DOCUMENTS

| | | | |
|---|---|---|---|
| 4,505,418 | 3/1985 | Neidig et al. | 228/122 |
| 4,950,558 | 8/1990 | Sarin | 428/698 |
| 5,049,408 | 9/1991 | Klinedinst et al. | 427/69 |
| 5,217,589 | 6/1993 | Arledge et al. | 204/192.3 |
| 5,382,471 | 1/1995 | Arledge et al. | 428/336 |
| 5,418,002 | 5/1995 | Paik et al. | 427/123 |

OTHER PUBLICATIONS

No. 3–103370(A) "Method For Modifying Surface And Cementing Of Ceramic Substrate"—Patents Abstracts of Japan, C–852 Jul. 23, 1991 vol. 15/No. 289.

JP94045509—Abstract "Surface Modified Aluminum Nitride Ceramic Substrate For Cementing Copper Plate To Surface Modified Aluminum Nitride Subtrate".

*Primary Examiner*—Merrick Dixon
*Attorney, Agent, or Firm*—Hoffman, Wasson & Gitler

[57] ABSTRACT

The invention relates to a novel ceramic substrate with at least one layer essentially of aluminum nitride which is provided on at least one surface side with an intermediate or auxiliary layer which contains aluminum oxide and which has a thickness in the range of 0.5–10 microns, and to a process for its production.

11 Claims, 2 Drawing Sheets

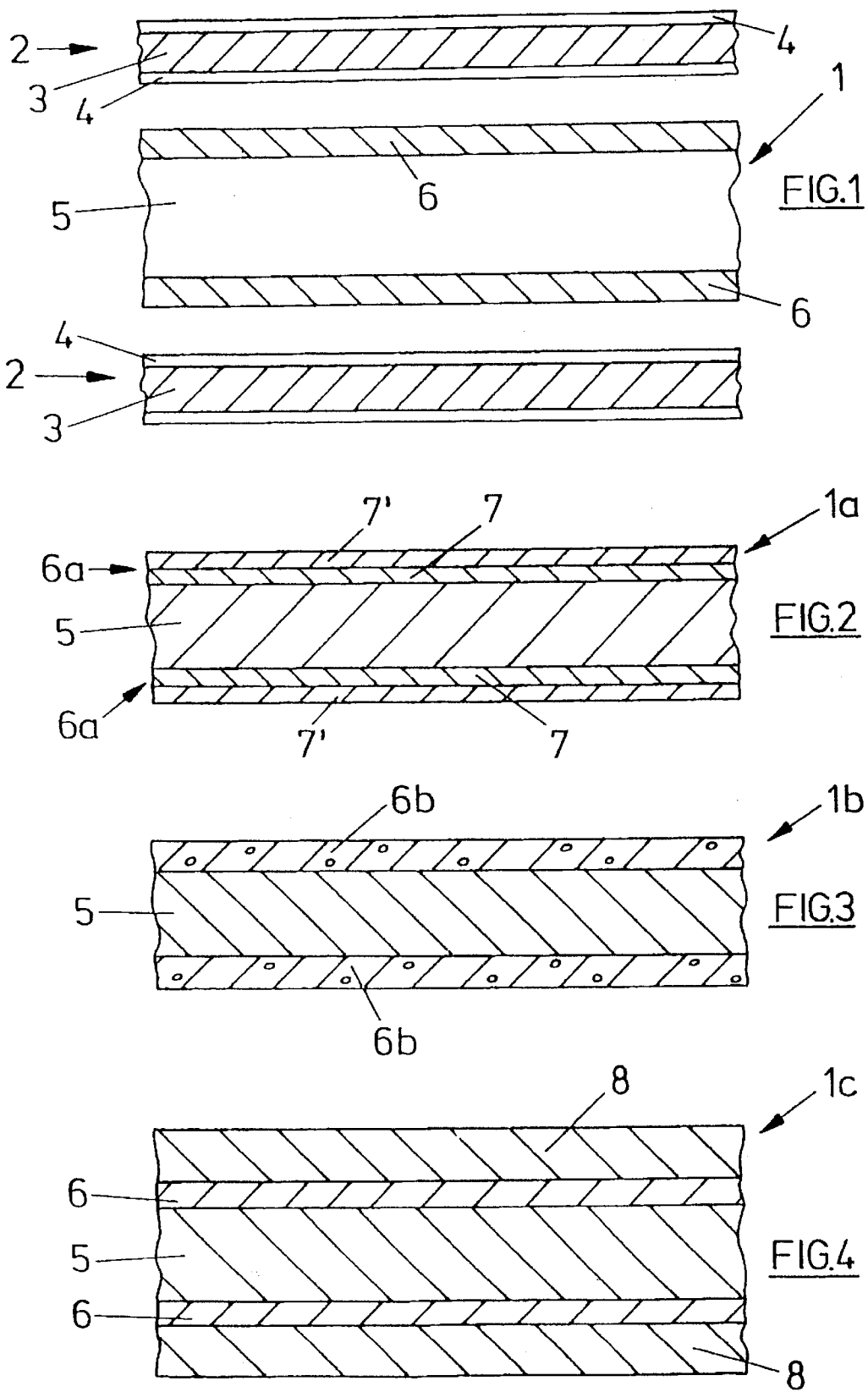

PROCESS FOR PRODUCING A CERAMIC SUBSTRATE AND A CERAMIC SUBSTRATE

BACKGROUND OF THE INVENTION

The invention relates to a process for producing a substrate with at least one layer of aluminum nitride ceramic, in which one auxiliary or intermediate layer of aluminum oxide is applied to at least one side of this layer.

The invention further relates to a substrate with at least one layer of aluminum nitride (AlN) which is provided on at least one surface side with an intermediate or auxiliary layer which contains aluminum oxide ($Al_2O_3$) and which has a thickness in the range of roughly 0.5–10 microns.

Ceramic substrates for electrical circuits or modules, especially for power circuits or modules, are known in the most varied versions. In particular, it is known to produce a metal coating, required for making printed conductors, terminals, etc., on an aluminum oxide ceramic using the so-called "DCB process" (direct copper bond technology) and using copper foils which are oxidized on their surfaces and which form the metallic coating. The copper oxide layer of these foils forms a eutectic with a melting point below the melting point of the copper so that by placing the foils on the ceramic and by heating all the layers they can be joined to one another, especially by melting on the copper, only in the area of the oxide layer. The DCB process is a technique known to one skilled in the art.

In power circuits, the use of an aluminum nitride ceramic instead of an aluminum oxide ceramic is desirable due to the thermal conductivity of the aluminum nitride ceramic, which is higher than that of the aluminum oxide ceramic.

In this case, the DCB process cannot be easily used for aluminum nitride ceramics.

It has been suggested to first apply a layer of aluminum oxide to the layer of aluminum nitride ceramic, such that this intermediate or auxiliary layer enables the application of a metallic coating or the copper layer using the DCB process. This intermediate layer has a roughness which improves adhesion on its exposed surface (DE-OS 35 34 886).

Furthermore, it was proposed that an aluminum oxide layer be applied to an initial substrate or carrier body of aluminum nitride, by flame spraying an aluminum oxide powder or in a screen printing process (DE-OS 38 44 264).

In all these known DCB processes, the disadvantage is that in spite of applying the auxiliary or intermediate layer of aluminum oxide, a flawless homogenous flat bond without faults is not achieved between the layer of aluminum nitride ceramic and the metal coating, but rather numerous faults occur, i.e., areas in which no bond has been formed or the metal coating has been lifted away from the ceramic by bubble formation. Thus the adhesive strength of the metal coatings and the thermal conductivity of the substrates overall are adversely affected.

To improve adhesive strength or bond quality, i.e., to reduce the bubble portion, it is proposed in DE 41 04 860.1 that oxidation of the aluminum nitride (AlN) be done to form the intermediate layer of aluminum oxide ($Al_2O_3$). This is accomplished in an oxygen atmosphere free of water vapor.

Conversely, it is proposed in WO 92/11 113 that the aluminum nitride be oxidized and cooled in a controlled manner under a water vapor-containing atmosphere to form the intermediate layer of aluminum oxide.

In JP 02-124 773 A (in Patent Abstracts of Japan C-743, Vol. 14/No. 342) it is proposed that the adhesive strength of the metal coating be increased by incorporating CaO and $SiO_2$ into the aluminum oxide ($Al_2O_3$) layer, CaO and $SiO_2$ originating from the sintering aids of the aluminum nitride (AlN) body.

One disadvantage of the aforementioned processes, is that the process parameters must be very accurately maintained and further these processes are not applicable to highly heat-conductive aluminum nitride which contains yttrium oxide ($Y_2O_3$) as the sintering aid.

In JP 03-228 885 A (in Patent Abstracts of Japan C-890, Vol. 16/No. 1) it is proposed in order to increase the adhesive strength that the aluminum oxide layers be doped with one or more elements of the group Ti, V, Mo, Mb, W, Co or Ni.

In WO 92/11 113 reference is made to a publication of Kuromitsu which relates to $SiO_2$—$Al_2O_3$ intermediate layers for increasing adhesive strength.

In our own extensive studies, however, the described results of the aforementioned known processes could not be confirmed. It is thus apparent that the process parameters must be precisely controlled or negative results occur even with small deviations.

The incorporation of $SiO_2$ cited in WO 92/11 113 moreover also engenders the danger that $SiO_2$ is present not as $SiO_2$ bound as mullite, but as free $SiO_2$ which reacts at the eutectic temperature with copper oxide to form a liquid phase and consumes the Cu—$Cu_2O$ eutectic which is necessary for the DCB process, with which the adhesive strength or bond quality would be strongly reduced.

The object of the invention is to devise a process for producing a ceramic substrate which avoids the aforementioned disadvantages and makes it possible to apply the metal coating to an aluminum oxide ceramic over a large area without faults.

SUMMARY OF THE INVENTION

To achieve this object a process for producing a substrate with at least one layer of aluminum nitride ceramic, in which an auxiliary or intermediate layer of aluminum oxide is applied to at least one side of this layer is characterized in that the intermediate layer is applied using a copper oxide-containing material such that the intermediate layer at least in part of its thickness contains a portion of copper oxide of roughly 0.05–44 percent by weight and that the layer of aluminum nitride first on at least one surface side is provided with a roughly $1.5 \times 10^{-4}$ to $1200 \times 10^{-4}$ micron thick layer of copper or copper oxide or other copper-containing compounds and then at a temperature between roughly 800–1300° C. is treated in an oxygen-containing atmosphere until an intermediate layer with the desired thickness is formed.

A substrate is formed with at least one layer which comprises aluminum nitride (AlN) and which is provided on at least one surface side with an intermediate or auxiliary layer which contains aluminum oxide ($Al_2O_3$) and has a thickness in the range from roughly 0.5 to 10 microns, and is characterized in that the intermediate layer has an additive present from 0.05–44 percent by weight of at least one copper oxide and that the proportion of copper oxide in the intermediate layer is uniformly distributed in clusters.

In the invention the intermediate layer applied to the aluminum nitride layer contains a small portion of copper oxide which is present and bound in the form of a spinel, for example, as $CuAl_2O_4$. Surprisingly, considerable compaction of the intermediate or auxiliary layer of aluminum oxide occurs due to the portion of copper oxide, so that diffusion of the nitrogen through the intermediate layer which is responsible for the faults and bubble formation in the prior art is effectively prevented. According to one finding underlying the invention, the improved seal can be attributed to the fact that by adding copper oxide in the intermediate or auxiliary layer those temperature changes which a substrate inevitably undergoes in conventional processes cannot lead to cracks or leaks in this intermediate layer. In this way, the passage of gas through this layer and as in the DCB process, the reaction of the aluminum nitride with the oxygen or the copper oxide of the copper foils, which normally causes the bubble fault, is effectively prevented. Compared to a pure $Al_2O_3$ layer, the reactivity of an $Al_2O_3$—$CuAl_2O_4$-intermediate layer with the liquid Cu—$Cu_2O$ eutectic is greatly improved.

According to the finding underlying the invention the improved seal can be attributed to the reduction of pore volume and prevention of crack formation during the temperature changes which necessarily occur and which a substrate undergoes in the conventional processes as a result of the incorporation of copper oxide into the $Al_2O_3$ phase.

BRIEF DESCRIPTION OF THE DRAWINGS

FIG. 1 is a cross-sectional view of an initial substrate;

FIG. 2 is a cross-sectional view of an initial substrate;

FIG. 3 is a cross-sectional view of an initial substrate;

FIG. 4 is a cross-sectional view of a substrate produced from initial substrate 1.

DETAILED DESCRIPTION OF THE PREFERRED EMBODIMENTS

Figure 5:
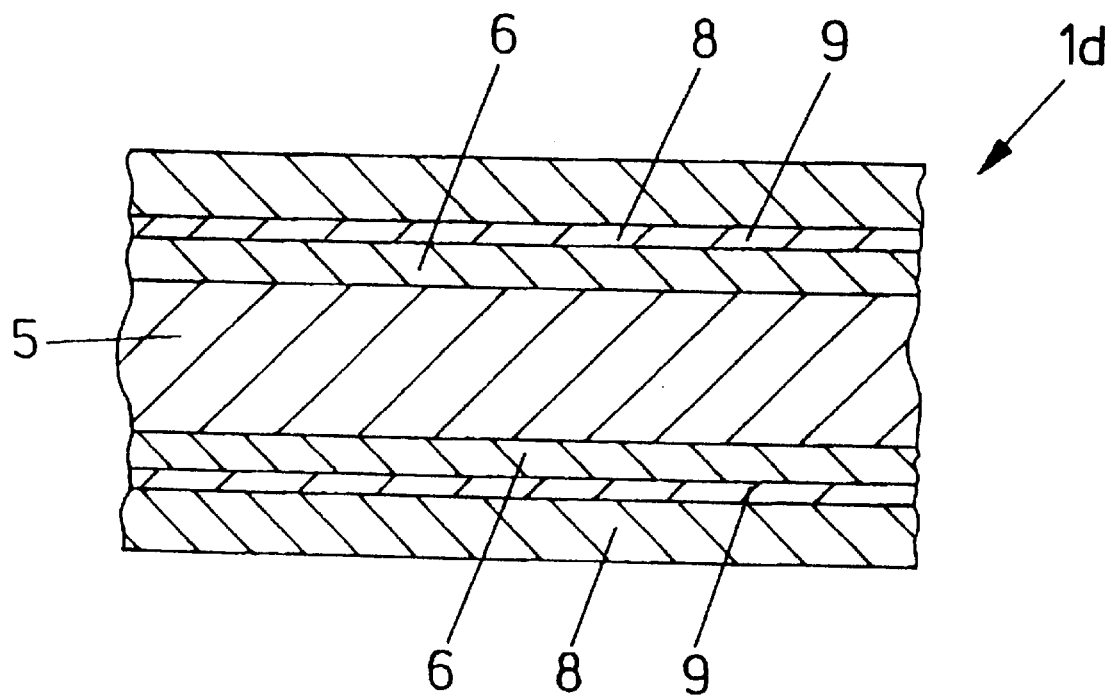
FIG. 5 is a cross-sectional view of a substrate produced from initial substrate 2, and is an alternate preferred embodiment.

The invention is detailed below using FIGS. 1–5 which each reproduce in a simplified representation and in cross section various possible embodiments of the substrate according to the invention.

In the figures, the initial substrate or a layer of aluminum nitride ceramic (AlN) is labelled 1.

In the embodiment assumed for FIG. 1 this initial substrate 1 is to be produced, using the DCB process known to one skilled in the art, with a metal coating on each of the two sides, i.e., with a thin copper layer or foil 2, each copper foil 2 being oxidized on both surface sides, i.e., consisting of core 3 of copper (Cu) and thin copper oxide layer 4 ($Cu_2O$/CuO) on both surface sides. Core 3 has a much greater thickness than that of two oxide layers 4.

To be able to bond copper layers 2 using the DCB process to initial substrate 1, the latter in the embodiment shown in FIG. 1 has in addition to core 5 of aluminum nitride ceramic (AlN) on both surface sides, layer 6 which consists of aluminum oxide ($Al_2O_3$) and which contains a portion of copper oxide ($Cu_2O$/CuO) in an amount between 0.05 to 44 percent by weight. The thickness of layers 6 is much less than the thickness of core 5 and is roughly between 0.5 and 10 microns.

It has been shown that only by means of the addition of copper oxide in the intermediate layer 6, there is produced a homogenous bond of initial substrate 1 with copper layers 2 even using the DCB process, i.e., a blanket bond without defects, i.e., without areas on which the bond between respective copper layer 2 and initial substrate 1 has not occurred or is disrupted by bubble formation.

As was detailed above, according to the finding underlying the invention this can only be achieved when intermediate layers 6 of aluminum oxide ceramic ($Al_2O_3$) which are fundamentally necessary for execution of the DCB process have the above described proportion of copper oxide, since in the conventional process steps major temperature changes of the initial substrate cannot be avoided after applying intermediate layers 6. These temperature fluctuations, according to the finding underlying the invention, in the absence of copper oxide in intermediate layers 6, lead to cracks or leaks with the result that in the area of these leaks the aluminum nitride of core 5 reacts directly with the copper oxide of oxide layers 4, preventing the desired bond from occurring between initial substrate 1 and the copper layers, and nitrogen is released resulting in bubble formation between respective copper layer 2 and the initial substrate, according to the following reaction equation:

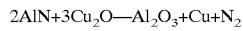

Surprisingly, the proportion of copper oxide incorporated into intermediate layers 6 causes their compaction such that these leaks or cracks do not occur for the temperature differences which are inevitable in the process in intermediate layers 6, nor do the associated disadvantages arise.

Since the thickness of intermediate layers 6 is roughly between 0.5 and 10 microns, these intermediate layers are sufficient for reliable bonding of the initial substrate with copper layers 2; the special advantage of the aluminum nitride, specifically the thermal conductivity which is much improved compared to the aluminum oxide ceramic, is however not adversely affected overall.

The initial substrate can be produced for example such that on core 5 of the aluminum nitride (AlN), there is provided on each side, a very thin layer, i.e., a layer with a thickness of roughly $1.5 \times 10^{-4}$ to $1200 \times 10^{-4}$ microns of copper or copper oxide or the corresponding ions of other copper-containing compounds and afterwards this core 5 is treated at a temperature in the range between roughly 800–1300° C., preferable at a temperature of 1200° C., in an oxidizing atmosphere.

The following processes are suitable, for example, for producing the initial substrate:

EXAMPLE 1

An AlN substrate consisting of roughly 96% AlN and with roughly 4% $Y_2O_3$ with a thickness of 0.63 mm and with dimensions of 108×108 mm is subjected to the following process steps:

1. Cleaning of the substrate by plasma etching;

2. Application of a uniform copper layer by sputtering onto both sides of the cleaned substrate with a total amount of 1.3 mg copper at a time.

3. Heating of the substrate in an atmosphere containing $N_2$ and $O_2$ in a proportion of 20:80 to a temperature of roughly 1280° C.;

4. Keeping the substrate at a temperature of 1280° C. for 30 minutes;

5. Cooling to room temperature;

6. Oxidizing a copper sheet measuring 100×100 mm and a thickness of 0.3 mm such that a uniform copper oxide layer of roughly 0.8 microns thick results;

7. Placing the copper sheet on the AlN substrate treated in steps 1–5;

8. Heating of the bond of substrate and copper sheet to 1071° C. in a gas atmosphere consisting of nitrogen with an oxygen portion of $40 \times 10^{-6}$;

9. Keeping the bond at the temperature for 2.5 minutes;

10. Cooling to room temperature.

A substrate of AlN with an intermediate layer of $Al_2O_3$ and $CuAl_2O_4$ and a securely bonded copper layer with a peel strength greater than 50 N/mm is obtained.

EXAMPLE 2

An AlN substrate consisting of roughly 96% AlN and with roughly 4% $Y_2O_3$ with a thickness of 0.63 mm and with dimensions of 108×108 mm is subjected to the following process steps:

1. Cleaning of the aluminum substrate with ultrasound in deionized water;

2. Currentless deposition of copper with a commercial bath until 1.8 mg copper total has been deposited on each side of the substrate;

3. This is followed by process steps 3–10 of example 1.

EXAMPLE 3

An AlN substrate consisting of roughly 96% AlN and with roughly 4% $Y_2O_3$ with a thickness of 0.63 mm and with dimensions of 108×108 mm is subjected to the following process steps:

1. Cleaning of the aluminum substrate with ultrasound in deionized water;

2. Heating of the substrate in a tube furnace to 1230° C. in an oxygen- and copper oxide-containing nitrogen atmosphere which is produced by routing an oxygen-nitrogen mixture (with an oxygen-nitrogen ratio of 20:80) over copper oxide heated to 1750° C.;

3. Keeping at 1230° C. for 45 minutes;

4. Continue with process steps 5–10 as in example 1 above.

Other processes for applying copper containing materials are possible for producing the $Al_2O_3$—$CuAl_2O_4$ intermediate layer, for example, screen printing, coating, dipping in solutions, etc.

Other processes are also conceivable for making available copper during the AlN oxidation phase, especially physical processes, for example, sputtering of CuO at temperatures between 800 and 1300° C. The formation of an intermediate layer of $Al_2O_3CuAl_2O_4$ is also important here.

Initial substrate 1 with core 5 of AlN and dense intermediate layers 6 of $Al_2O_3$ and copper oxide is obtained with these aforementioned processes. The ratio of $Al_2O_3$ to copper oxide can be varied by the layer thickness of the previously applied copper or copper oxide in combination with the temperature and duration of firing.

FIG. 2 shows initial substrate 1a which differs from the initial substrate of FIG. 1 in that intermediate layers 6a there in addition to layers 7 of $Al_2O_3$ directly adjacent to core 5 with the portion of copper oxide have another layer 7' which is applied to each of these layers and which consists exclusively of aluminum oxide ceramic ($Al_2O_3$). This initial substrate 1a shown in FIG. 2 can be obtained with techniques known to one skilled in the art, for example, by additional application or spraying of layers 7' in the plasma.

FIG. 3 shows initial substrate 1b which differs from the initial substrate of FIG. 1 in that in initial substrate 1b in intermediate layers 6b there the copper oxide is present uniformly distributed in aluminum oxide in small clusters with a diameter of less than 0.01 micron.

FIG. 4 shows in cross section a substrate which is produced for example from initial substrate 1 using two copper layers 2. Accordingly, this substrate has core 5 of AlN which has provided on both sides, an intermediate layer 6, on which a metal coating 8 is applied over a large area using the DCB process to form substrate 1c.

FIG. 5 finally shows substrate 1d which differs from substrate 1c essentially in that the copper foils used to produce metal coating 8 on their surface sides have an oxygen-rich copper phase, i.e., an oxide layer with great thickness, for example, with a thickness of at least 3 microns, so that between intermediate layer 6 and each copper layer 8 there is layer 9 which contains copper and copper oxide ($Cu+Cu_2O$).

The invention was described above using embodiments. It goes without saying that numerous changes or modifications are possible without departing from the inventive idea underlying the invention. Thus, using the above described technique it is especially possible to produce substrates which have a metal coating only on one side of the aluminum nitride ceramic and/or to produce these substrates which have a plurality of metal layers with interposed ceramic layers, of which at least some are then formed by the aluminum nitride ceramic provided with intermediate layers 6 or 6b.

| |
|---|
| 1 initial substrate |
| 2 copper foil or copper layer |
| 3 core |
| 4 oxide layer |
| 5 core |
| 6 intermediate layer |
| 7 intermediate layer |
| 8 metal coating |
| 9 copper-copper oxide layer |

What is claimed:

1. A process for producing a ceramic substrate comprising the steps of:

providing a substrate layer comprising an aluminum nitride ceramic;

applying a copper layer comprising copper or copper oxide to at least one side of said substrate layer, the copper layer being applied in an oxygen-containing atmosphere at a temperature ranging from 800° C. to 1300° C. such that an intermediate layer comprising an aluminum oxide and a copper oxide is formed on said at least one side of the substrate layer.

2. The process of claim 1, wherein the intermediate layer contains copper oxide in the range of 0.05 to 44% by weight.

3. The process of claim 1, wherein the intermediate layer has a thickness in the range of 0.5 to 10 microns.

4. The process of claim 1, wherein the intermediate layer is formed with a copper oxide layer having a thickness in the range of $1.5 \times 10^{-4}$ microns.

5. The process of claim 1, wherein the intermediate layer is formed by:

applying a uniform copper layer by sputtering to at least one side of the aluminum nitride ceramic;

heating the substrate in a atmosphere containing $N_2$ and $O_2$ in a 20:80 proportion to a temperature of 1280° C.;

maintaining the temperature of 1280° C. for 30 minutes; and cooling to room temperature.

6. The process of claim 1, further comprising the step of applying a layer of aluminum oxide onto the intermediate layer.

7. The process of claim 1, further comprising the step of applying a metal layer onto the intermediate layer.

8. The process of claim 7, further comprising the step of applying a layer comprising a copper and/or a copper oxide between the intermediate layer and the metal layer.

9. The process of claim 1, wherein the copper oxide is uniformly distributed in clusters.

10. The process of claim 9, wherein the clusters have a diameter of less than 0.01 microns.

11. The process of claim 1, wherein the concentration of copper oxide in said intermediate layer decreases with increasing distance from said substrate layer.

* * * * *